(12) United States Patent
Kurogo et al.

(10) Patent No.: US 8,058,941 B2
(45) Date of Patent: Nov. 15, 2011

(54) VOLTAGE CONTROL TYPE TEMPERATURE COMPENSATION PIEZOELECTRIC OSCILLATOR

(75) Inventors: Shigehisa Kurogo, Chigasaki (JP); Masayuki Ishikawa, Ebina (JP); Atsushi Kiyohara, Chigasaki (JP); Takehiro Yamamoto, Machida (JP); Norihito Matsukawa, Suwa (JP)

(73) Assignee: Seiko Epson Corporation (JP)

( * ) Notice: Subject to any disclaimer, the term of this patent is extended or adjusted under 35 U.S.C. 154(b) by 64 days.

(21) Appl. No.: 12/619,004

(22) Filed: Nov. 16, 2009

(65) Prior Publication Data

US 2010/0127787 A1    May 27, 2010

(30) Foreign Application Priority Data

Nov. 26, 2008   (JP) ................................. 2008-300517

(51) Int. Cl.
*H03B 5/32*      (2006.01)
*H03L 1/02*      (2006.01)
(52) U.S. Cl. ...................... 331/158; 331/116 R; 331/176
(58) Field of Classification Search .............. 331/116 R, 331/154, 158, 176
See application file for complete search history.

(56) References Cited

U.S. PATENT DOCUMENTS

| 4,254,382 | A  | * | 3/1981  | Keller et al. ............... 331/116 R |
| 4,851,791 | A  | * | 7/1989  | Marotel ......................... 331/158 |
| 5,041,799 | A  | * | 8/1991  | Pirez ............................... 331/44 |
| 5,224,643 | A  | * | 7/1993  | Kojima et al. ............. 242/615.3 |
| 5,705,957 | A  | * | 1/1998  | Oka et al. ........................ 331/66 |
| 6,584,380 | B1 | * | 6/2003  | Nemoto ........................ 700/299 |
| 6,667,664 | B2 | * | 12/2003 | Akagawa et al. ............... 331/68 |
| 6,731,181 | B2 | * | 5/2004  | Fukayama et al. ........... 331/176 |

FOREIGN PATENT DOCUMENTS

JP         2002-217643          8/2002
* cited by examiner

*Primary Examiner* — Levi Gannon
(74) *Attorney, Agent, or Firm* — Harness, Dickey & Pierce, P.L.C.

(57) ABSTRACT

A voltage control type temperature compensation piezoelectric oscillator, includes: a voltage control type oscillation circuit; an automatic frequency control (AFC) circuit outputting a control voltage for controlling an oscillation frequency of the voltage control type oscillation circuit based on an external control voltage; a temperature compensation voltage generating circuit generating a temperature compensation voltage; and a gain variable circuit varying a gain of the temperature compensation voltage. In the oscillator, the gain variable circuit is controlled by the control voltage outputted from the AFC circuit, and the oscillation frequency of the voltage control type oscillation circuit is controlled by an output voltage of the gain variable circuit.

2 Claims, 12 Drawing Sheets

PRIOR ART

VOLTAGE CONTROL TYPE TEMPERATURE COMPENSATION PIEZOELECTRIC OSCILLATOR

BACKGROUND

1. Technical Field

The present invention relates to a voltage control type temperature compensation piezoelectric oscillator used in a communication device and the like. Especially, the voltage control type temperature compensation piezoelectric oscillator is preferably used for improving a shift of a temperature compensation voltage caused by variation of a control voltage.

2. Related Art

Piezoelectric oscillators are used in various areas such as communication devices and electric devices due to their advantageous points such as small size, light weight, and low cost. Especially, a voltage control type temperature compensation piezoelectric oscillator (hereinafter, referred to as VC-TCXO) is widely used, for example, used in a cell-phone. The VC-TCXO compensates a frequency-temperature characteristic of a piezoelectric resonator, and an oscillation frequency thereof can be varied depending on applied voltage.

Figure 12:
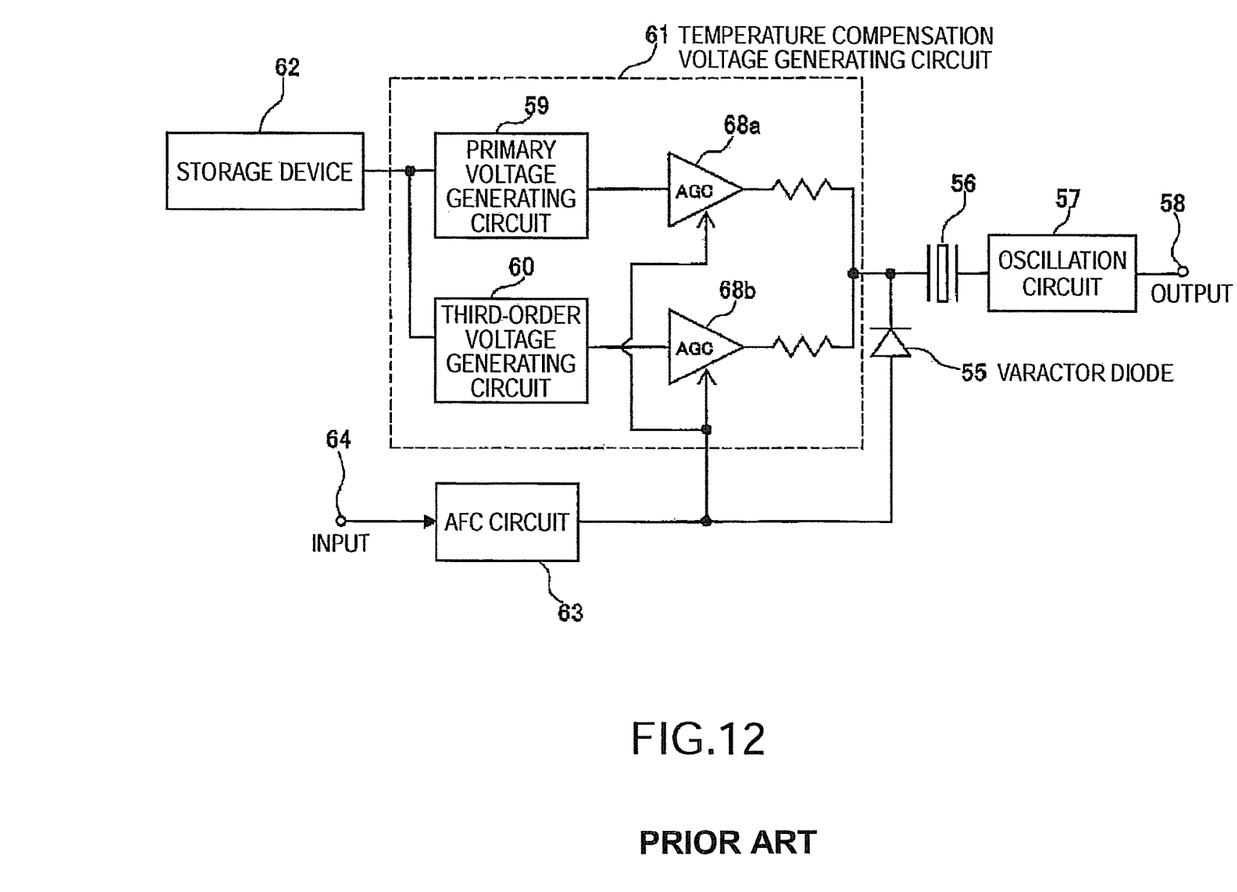
FIG. 12 is a circuit diagram showing a voltage control type temperature compensation piezoelectric oscillator of a related art.

JP-A-2002-217643 is an example of a related art. The example discloses a temperature compensation voltage generating circuit of a quartz crystal oscillator. FIG. 12 is a block diagram showing a structure of a voltage control type oscillation circuit including: a quartz crystal oscillator composed of a varactor diode 55, a quartz crystal resonator 56, and an oscillation circuit 57; a temperature compensation voltage generating circuit 61; a storage device 62; and an AFC circuit 63.

The temperature compensation voltage generating circuit 61 includes a gain control amplifier (hereinafter, referred to as "AGC") 68a for controlling an output voltage of a primary voltage generating circuit 59, and an AGC 68b for controlling an output voltage of a third-order voltage generating circuit 60. Gains of the AGCs 68a and 68b are controlled by an output voltage value of the AFC circuit 63.

Commonly, a frequency-voltage (f-V) characteristic of the varactor diode 55 does not exhibit a straight line. Here, a case where an output voltage Vc of the AFC circuit 63 is a center value Vcm is set to be a reference. Under this case, a varying amount Δf of a frequency differs from a varying amount ΔV of the output voltage Vc depending on whether the output voltage Vc is larger than the center value Vcm or smaller.

The circuit is structured such that when the output voltage of the AFC circuit 63 is higher than the center value Vcm, the gains of the AGCs 68a and 68b are decreased, and when the output voltage is lower than the center value Vcm, the gains of the AGCs 68a and 68b are increased.

The gains of the AGCs 68a and 68b are optimized based on the f-V characteristic of the varactor diode 55 so as to make the varying amount of the oscillation frequency as constant as possible within a variable range of the AFC circuit 63. Accordingly, a voltage control type temperature compensation quartz crystal oscillator maintains linearity of an output oscillation frequency for a control voltage, and achieves highly-accurate temperature compensation.

The example discloses that even when the f-V characteristic of the varactor diode exhibits a curve, the temperature compensation voltage generating circuit of the example compensates for the curve and keeps the linearity of the output oscillation frequency for the control voltage as a voltage controlled oscillator (VCO), being able to realize temperature compensation.

Figure 13:
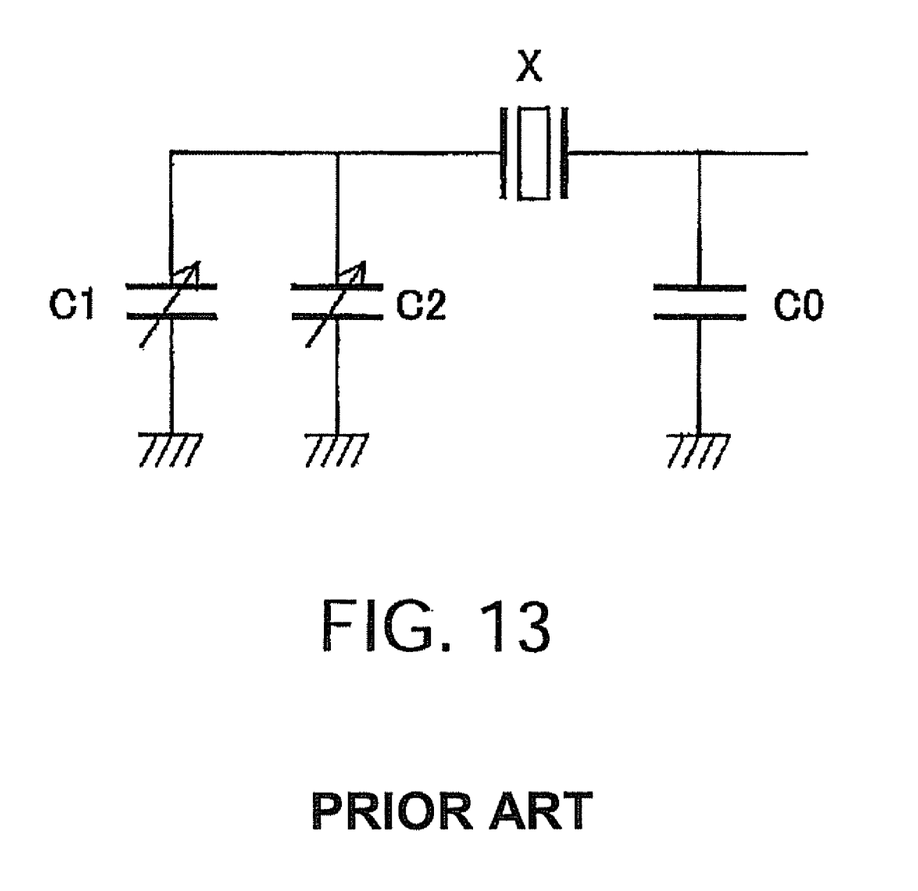
FIG. 13 is a diagram showing a circuit including a piezoelectric resonator X, a variable capacitance element C1 for temperature compensation, a variable capacitance element C2 for varying a frequency, and a load capacitance C0.

A frequency variable part around the piezoelectric resonator of the VC-TCXO is a circuit in which a parallel circuit including a variable capacitance element C1 for compensating the frequency-temperature characteristic of a piezoelectric resonator X and a variable capacitance element C2 for varying an oscillation frequency of the piezoelectric resonator X, and a load capacitance C0 are coupled with the piezoelectric resonator X in series, as shown in FIG. 13.

When the control voltage Vc of the VC-TCXO is set to be at the center value Vcm, a value of the variable capacitance element C2 is uniquely determined. The load capacitance C0 and the like are adjusted under this state so as to adjust the oscillation frequency of the VC-TCXO at a predetermined center frequency. The load capacitance C0 is fixed after the adjustment. Then output voltages of the primary voltage generating circuit and the third or higher-order voltage generating circuit are adjusted to be applied to the variable capacitance element C1 for temperature-compensating the voltages. Thus the temperature compensation is carried out so as to obtain a desired frequency-temperature characteristic.

However, when the external control voltage Vc of the AFC circuit is varied to vary the oscillation frequency of the VC-TCXO as the primary function of the VC-TCXO, an initial value of the variable capacitance element C2 is varied, whereby the frequency-temperature characteristic is shifted from the initial characteristic disadvantageously.

The phenomenon of the shift of the frequency-temperature characteristic is circumstantially described by using numerical values.

In the circuit of FIG. 13, the load capacitance C0 is set to be 30 pF, a value of the control voltage Vc is set to be $Vc_L$, and a capacitance value of the variable capacitance element C2 is set to be 5 pF. A capacitance value of the variable capacitance element C1 for temperature compensation is set to vary within a range from 5 pF to 15 pF ($C1_{MIN}$=5 pF, $C1_{MAX}$=15 pF) by the output voltages of the primary voltage generating circuit and the third or higher-order voltage generating circuit due to temperature change. Equations of $(C1_{MAX}+C2)=C_{DS}$ and $(C1_{MIN}+C2)=C_{SS}$ are set to be satisfied. In a case where the capacitance value of the variable capacitance element C1 is varied within the range from 5 pF to 15 pF, a varying amount $\Delta C_L$ of a load capacitance $C_L$ of the piezoelectric resonator X is expressed as $\Delta C_L = (C_{DS} \times C0)/(C_{DS}+C0) - (C_{SS} \times C0)/(C_{SS}+C0)$. The above numeral values are assigned to this equation, deriving the relation: $\Delta C_L$=4.5 pF.

Next, the value of the control voltage Vc is set to be $Vc_S$, and the capacitance value of the variable capacitance element C2 is set to be 15 pF. In this case, the varying amount $\Delta C_L$ of the load capacitance $C_L$ of the piezoelectric resonator X is expressed as: $\Delta C_L$=3.0 pF.

That is, the capacitance variation, for temperature compensation, of the piezoelectric resonator X differs depending on the value of the control voltage Vc applied to the variable capacitance element C2. As a result, even if the temperature compensation of the VC-TCXO is carried out at the center value Vcm of the control voltage Vc, the frequency-temperature characteristic is shifted (deteriorated) from the initial characteristic when the control voltage Vc is actually varied.

SUMMARY

An advantage of the present invention is to provide a VC-TCXO of which a frequency-temperature characteristic is maintained within a desired range even when a voltage of an AFC circuit is varied.

The present invention is intended to solve at least part of the mentioned problems and may be implemented by the following aspects of the invention.

A voltage control type temperature compensation piezoelectric oscillator according to an aspect of the invention includes: a voltage control type oscillation circuit; an automatic frequency control (AFC) circuit outputting a control voltage for controlling an oscillation frequency of the voltage control type oscillation circuit based on an external control voltage; a temperature compensation voltage generating circuit generating a temperature compensation voltage; and a gain variable circuit varying a gain of the temperature compensation voltage. In the oscillator, the gain variable circuit is controlled by the control voltage outputted from the AFC circuit, and the oscillation frequency of the voltage control type oscillation circuit is controlled by an output voltage of the gain variable circuit.

With such the structure, a gain of the gain variable circuit is controlled to be decreased when the external control voltage is higher than a center value, and controlled to be increased when the external control voltage is lower than the center value. Therefore, even though the external control voltage is shifted from the center value, the frequency-temperature characteristic is advantageously maintained approximately within an initially adjusted range.

In the voltage control type temperature compensation piezoelectric oscillator according to the aspect, the temperature compensation voltage generating circuit may include: a temperature sensor; a primary voltage generating circuit; a high-order voltage generating circuit for a third-order voltage or a higher-order voltage; and an adder circuit adding a primary voltage generated by the primary voltage generating circuit and a high-order voltage generated by the high-order voltage generating circuit.

Such the structure of the temperature compensation voltage generating circuit enables highly-accurate temperature compensation. In addition, the frequency-temperature characteristic of the voltage control type oscillation circuit is maintained approximately within a desired range even though the external control voltage is varied.

In the voltage control type temperature compensation piezoelectric oscillator according to the aspect, the voltage control type oscillation circuit may include: a piezoelectric resonator; a first variable capacitance element for temperature compensation; and a second variable capacitance element for varying a center frequency. The first variable capacitance element and the second variable capacitance element are coupled to the piezoelectric resonator.

Such the structure enables desired temperature compensation and variation of the oscillation frequency. In addition, the frequency-temperature characteristic is advantageously maintained at a specified value even though the external control voltage is varied.

In the voltage control type temperature compensation piezoelectric oscillator according to the aspect, the first variable capacitance element and the second variable capacitance element may be respectively coupled to both terminals of the piezoelectric resonator.

In such the structure, the variable capacitance element for temperature compensation and the variable capacitance element for varying a frequency are disposed symmetrically to the piezoelectric resonator, so that the oscillation frequency is stable and the frequency-temperature characteristic is maintained at a specified value even though the external control voltage is varied, advantageously.

In the voltage control type temperature compensation piezoelectric oscillator according to the aspect, the gain variable circuit may include an operational amplifier, a first resistor, a second resistor, a transistor, and a reference voltage, and the second resistor and the transistor may be coupled in parallel and be coupled to an input terminal and an output terminal of the operational amplifier.

When the gain variable circuit is structured as this, the gain variable circuit is arbitrarily controlled even though the external control voltage is varied, so as to apply an appropriate compensation voltage to the variable capacitance element for temperature compensation, advantageously.

In the voltage control type temperature compensation piezoelectric oscillator according to the aspect, the gain variable circuit may include an operational amplifier, a first resistor, a second resistor, a transistor, and a reference voltage, and the first resistor and the transistor may be coupled in parallel and be coupled to an input terminal of the operational amplifier.

When the gain variable circuit is structured as this, a more proper gain variable circuit can be selected, thus providing a wider selecting range of a gain variable circuit advantageously.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings.

First Embodiment

Figure 1A:
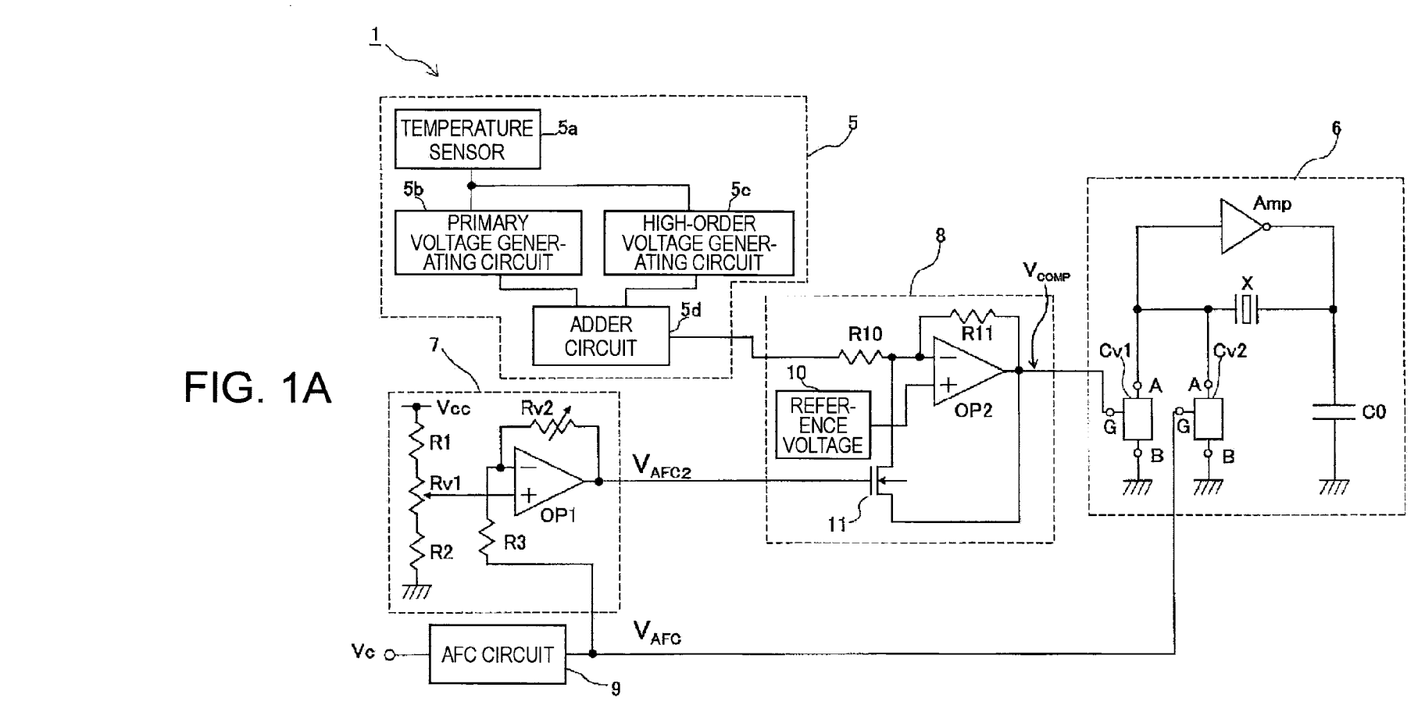
FIG. 1A is a circuit diagram showing a voltage control type temperature compensation piezoelectric oscillator according to a first embodiment of the invention.

FIG. 1A is a block diagram showing a structure of a voltage control type temperature compensation piezoelectric oscillator according to a first embodiment of the invention.

This voltage control type temperature compensation piezoelectric oscillator (hereinafter, referred to as "VC-TCXO") 1 includes: a temperature compensation voltage generating circuit 5 generating a temperature compensation voltage; a voltage control type oscillation circuit 6; an offset compensation circuit 7; a gain variable circuit 8 varying a gain of a temperature compensation voltage outputted from the temperature compensation voltage generating circuit 5; and an automatic frequency control (AFC) circuit 9 controlling an oscillation frequency of the voltage control type oscillation circuit 6 based on an external control voltage.

The gain variable circuit 8 is controlled by a control voltage outputted from the AFC circuit 9 and the oscillation frequency of the voltage control type oscillation circuit 6 is controlled by an output voltage of which the gain is controlled by the gain variable circuit 8.

The temperature compensation voltage generating circuit 5 includes: a temperature sensor 5a sensing a temperature of the inside of the VC-TCXO; a primary voltage generating circuit 5b generating a primary voltage based on an output voltage of the temperature sensor 5a; a high-order voltage generating circuit 5c generating a third- or higher-order voltage such as third-, fourth-, and fifth-voltage; and an adder circuit 5d adding an output voltage of the primary voltage generating circuit 5b and an output voltage of the high-order voltage generating circuit 5c.

In a common VC-TCXO, a primary voltage generating circuit and a third-order voltage generating circuit are commonly used as voltage generating circuits of the temperature compensation voltage generating circuit 5.

In contrast, in a case of manufacturing a TCXO and a VC-TCXO having higher stability like the present embodiment, a frequency-temperature characteristic of a piezoelectric resonator such as an AT-cut quartz crystal resonator is approximated by a high-order polynominal. In order to compensate the frequency-temperature characteristic, the primary voltage generating circuit and the high-order voltage generating circuit for third-, fourth-, fifth-, and the higher-order voltage are used. Compensation of a second-order is carried out by processing temperature T information among data of a temperature T-output voltage $V_T$ characteristic of the temperature sensor 5a.

The voltage control type oscillation circuit 6 includes: a piezoelectric resonator X; an amplifier Amp; first and second variable capacitance elements Cv1 and Cv2; and a fixed capacitance C0. The amplifier Amp and the piezoelectric resonator X are coupled in parallel, and the first variable capacitance element Cv1 for temperature compensation and the second variable capacitance element Cv2 for varying a center frequency are coupled between one terminals of the amplifier Amp and the piezoelectric resonator X and the ground. Further, the fixed capacitance C0 is coupled between the other terminals and the ground.

As known, the voltage control type oscillation circuit varies a voltage applied to the variable capacitance element so as to vary a capacitance of the variable capacitance element, thereby controlling an oscillation frequency of the piezoelectric oscillator.

Figure 2A:
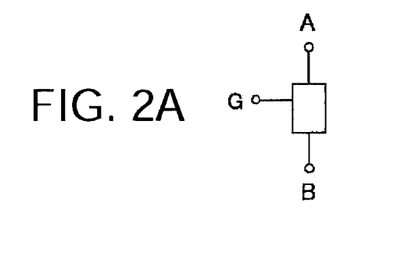
FIG. 2A is a diagram showing a symbol of a variable capacitance element.
Figures 2B, 2C:
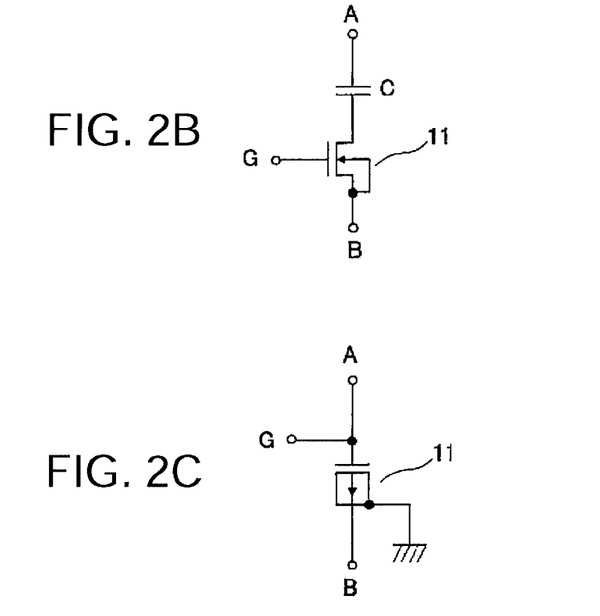
FIGS. 2B and 2C are diagrams showing a variable capacitance element including a MOS-FET.

As the first and second variable capacitance elements Cv1 and Cv2, a transistor (nMOS-FET, pMOS-FET) as shown in FIGS. 2B and 2C is used.

Figure 2D:
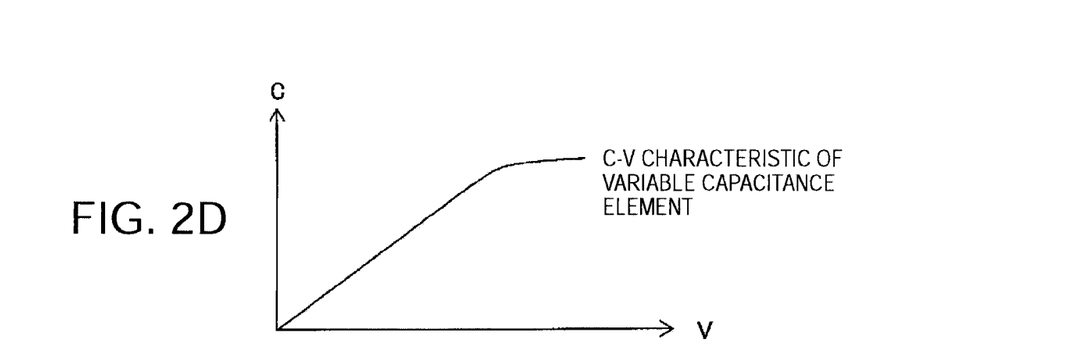
FIG. 2D is a graph showing a C-V characteristic of the variable capacitance element.
Figure 2E:
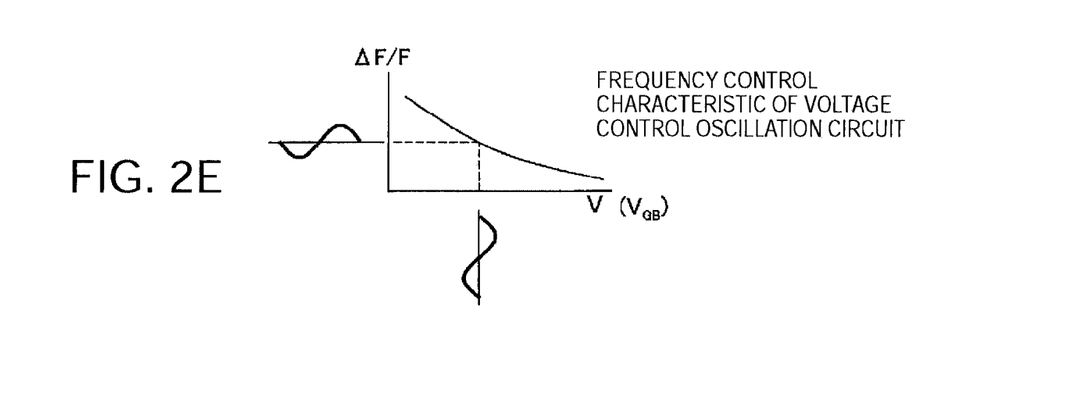
FIG. 2E is a diagram showing frequency control characteristic of a voltage control type oscillation circuit.

FIG. 2A shows symbols of the variable capacitance element. In FIG. 2A, G denotes a gate, and A and B denote two terminals and have a capacitance therebetween. FIG. 2B shows an example in which a capacitor C is coupled to one terminal of the nMOS-FET, and the other terminal of the capacitor C, the other terminal of the nMOS-FET, and a gate of the nMOS-FET are respectively set to be A terminal, B terminal, and G terminal. FIG. 2C shows an example in which a gate and a back gate of the pMOS-FET are respectively set to be A terminal and B terminal. FIG. 2D is a graph showing a relationship between a voltage V applied to the gate G and capacitance C between the terminals A and B. FIG. 2E shows a relationship between a voltage $V_{GB}$ between the gate and the back gate and frequency variation ΔF/F in a case of using the variable capacitance element shown in FIG. 2C, for example, in a piezoelectric oscillator.

The offset compensation circuit 7 includes; an operational amplifier OP1; resistors R1, R2, and R3; and variable resistors Rv1 and Rv2. A series circuit composed of the resistor R1, the variable resistor Rv1, and the resistor R2 is coupled between a power source Vcc and the ground, a variable terminal of the variable resistor Rv1 is coupled to non-inverting input terminal of the operational amplifier OP1, and an output of the AFC circuit 9 is coupled to an inverting input terminal of the operational amplifier OP1 through the resistor R3. Further, the variable resistor Rv2 is coupled between an output of the operational amplifier OP1 and the inverting input terminal of the same. An output voltage of the offset compensation circuit 7 is adjusted by adjusting the variable resistors Rv1 and Rv2.

The gain variable circuit 8 includes: an operational amplifier OP2; first and second resistors R10 and R11; a transistor (nMOS-FET) 11; and a reference voltage 10.

An output of the reference voltage 10 is coupled to a non-inverting input terminal of the operational amplifier OP2, and an output of the adder circuit 5d of the temperature compensation voltage generating circuit 5 is coupled to the inverting input terminal of the operational amplifier OP2 through the resistor R10. An output of the operational amplifier OP2 is coupled to the inverting input terminal through the resistor R11, and an output of the offset compensation circuit 7 is coupled to a gate of the nMOS-FET 11 so as to couple a drain terminal and a source terminal of the nMOS-FET 11 in parallel with a terminal of the resistor R11.

The AFC circuit 9 is composed of an invert-amplifying circuit in which an external control voltage Vc is inputted into an input, and the resulting output is inputted into the inverting input terminal of the operational amplifier OP1 of the offset compensation circuit 7 through the resistor R3 and also inputted into the gate G of the variable capacitance element Cv2 of the voltage control type oscillation circuit 6.

Figure 3:
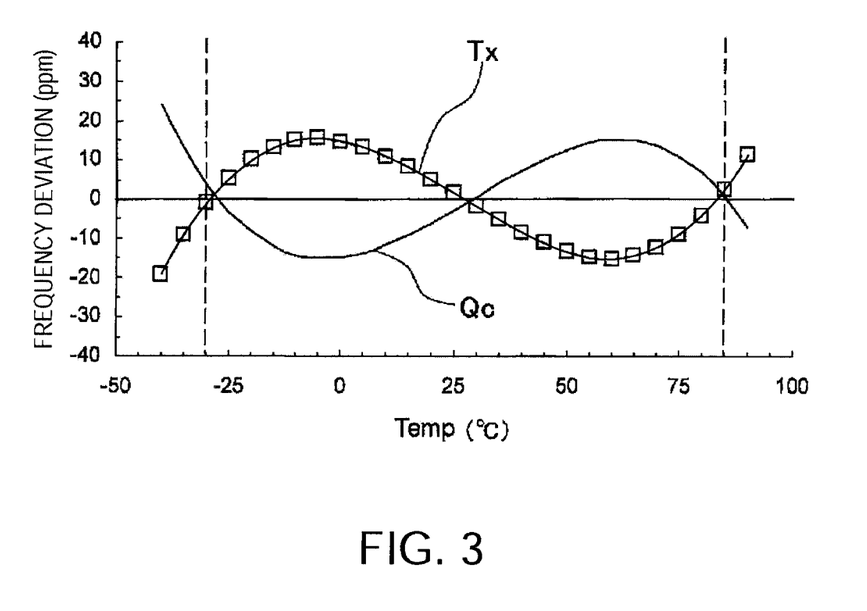
FIG. 3 is a graph showing a temperature characteristic of a piezoelectric resonator and a compensation characteristic of a circuit side.

FIG. 3 is a graph for explaining compensation of the frequency-temperature characteristic of the piezoelectric resonator. In FIG. 3, Tx denotes a frequency-temperature characteristic (Δf/f-T) of the piezoelectric resonator, and Qc denotes a compensation characteristic of an oscillation circuit side for canceling the frequency-temperature characteristic (Δf/f-T).

Here, the temperature Temp is abbreviated to T.

Figure 4:
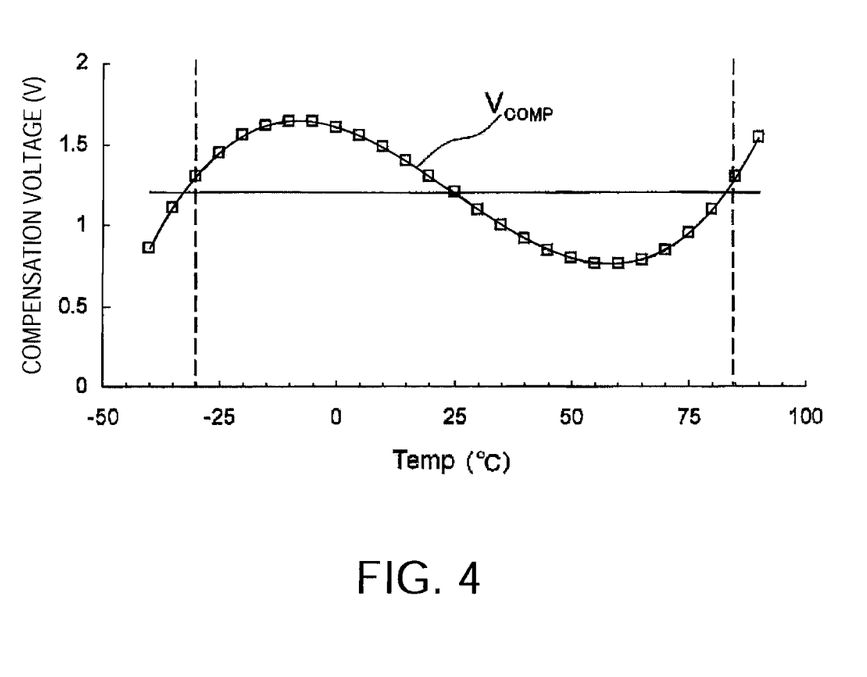
FIG. 4 is a graph showing a temperature characteristic of a temperature compensation voltage.

FIG. 4 is a graph showing a characteristic between a compensation voltage $V_{COMP}$, which is applied to the variable capacitance element Cv1 so as to generate a compensation characteristic, and a temperature T.

Figure 1B:
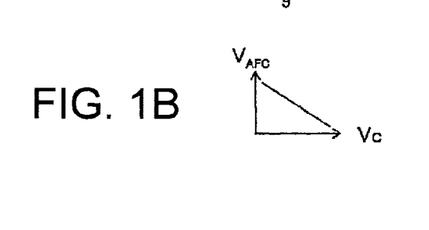
FIG. 1B is a graph showing a relationship between an external control voltage Vc and an output voltage $V_{AFC}$.

When the external control voltage Vc of the VC-TCXO 1 shown in FIG. 1 is set to be the center value Vcm, the voltage Vc is inverted and amplified at the AFC circuit 9 as shown in FIG. 1B, obtaining an output voltage $V_{AFC}$m. The voltage $V_{AFC}$m is applied to the second variable capacitance element Cv2, whereby the second variable capacitance element Cv2 obtains a capacitance value Cm. Under this state, the primary voltage generating circuit 5b, the high-order voltage generating circuit 5c, the offset compensation circuit 7, and the gain variable circuit 8 are adjusted so as to carry out temperature compensation of the piezoelectric resonator X. The center frequency is adjusted by fine-adjusting the fixed capacitance C0.

An operation of the VC-TCXO 1 according to the present embodiment will now be described.

Since the AFC circuit 9 is an inverting-amplifying circuit, a relationship between the external control voltage Vc at an input of the AFC circuit 9 and the output voltage $V_{AFC}$ of the AFC circuit 9 is expressed as FIG. 1B. That is, the AFC circuit 9 operates such that as the external control voltage Vc becomes higher (is increased), the output voltage $V_{AFC}$ becomes low (is decreased).

Figure 1C:
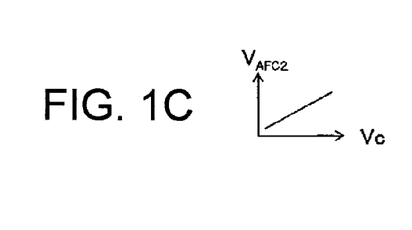
FIG. 1C is a graph showing a relationship between the external control voltage Vc and an output voltage $V_{AFC2}$ of an offset compensation circuit 7.

Since the offset compensation circuit 7 is an inverting-amplifying circuit including the operational amplifier, the voltage $V_{AFC}$ at an input is inverted to be an output voltage $V_{AFC2}$. Therefore, a relationship between the external control voltage Vc and the output voltage $V_{AFC2}$ of the offset compensation circuit 7 is expressed as shown in FIG. 1C. That is, the offset compensation circuit 7 operates such that as the external control voltage Vc is increased, the output voltage $V_{AFC2}$ is also increased accordingly.

Figure 5:
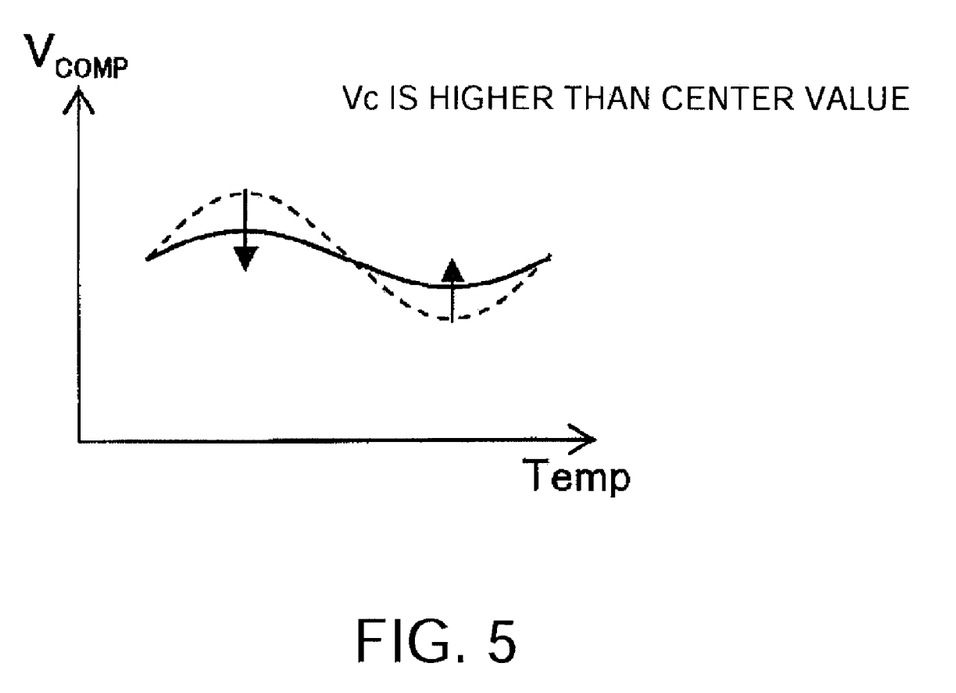
FIG. 5 is a graph showing a temperature characteristic of a related art temperature compensation voltage and a temperature characteristic of the temperature compensation voltage of the present embodiment in a case where the external control voltage Vc is higher than a center value.

The output voltage $V_{AFC2}$ of the offset compensation circuit 7 is applied to the gate of the nMOS-FET (transistor) 11 of the gain variable circuit 8. The voltage $V_{AFC2}$ varying in proportion to the voltage Vc is applied to the gate G of the nMOS-FET 11. Therefore, when the external control voltage Vc is higher than the center value Vcm, the $V_{AFC2}$ is larger than a drain current of a case where the external control voltage Vc is the center value Vcm. That is, a resistance value of the nMOS-FET 11 is small. The nMOS-FET 11 and the resistor R11 are coupled in parallel, so that their combined resistance $R_A$ is small. A gain of the gain variable circuit 8 is expressed as $-R_A/R10$, so that the gain of the gain variable circuit 8 is small. Accordingly, amplitude of the temperature compensation voltage $V_{COMP}$ which is an output voltage of the gain variable circuit 8 is decreased, and amplitude of a curve of the temperature compensation voltage $V_{COMP}$ is compressed from a dashed line to a solid line as shown in FIG. 5.

Figure 6A:
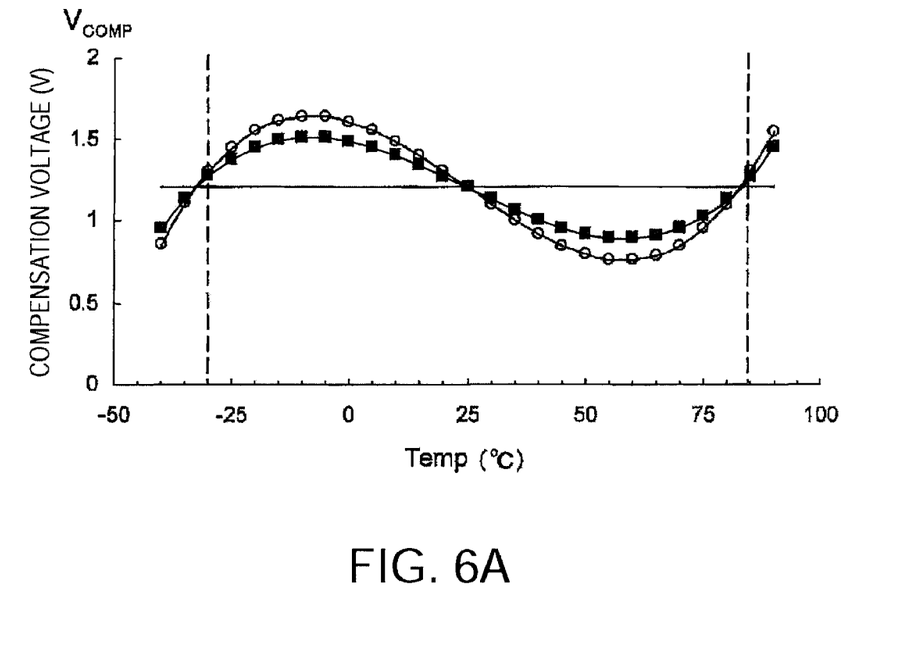
FIG. 6A is a graph showing a temperature characteristic of a temperature compensation voltage of the related art and a temperature characteristic of the temperature compensation voltage of the present embodiment in actual measurement.

FIG. 6A is a graph showing a relationship between a temperature T and a compensation voltage $V_{COMP}$ in a case where the external control voltage Vc is higher than the center value Vcm. A curve with white circles (○) shows a relationship between a compensation voltage $V_{COMP}$ of a related art VC-TCXO and a temperature T. When the external control voltage Vc is high, the output voltage of the AFC circuit becomes low and therefore the capacitance of the variable capacitance element becomes small, whereby sensitivity in the temperature compensation is too high. That is, as difference between the external control voltage Vc and the center value Vcm becomes large, an amount of the temperature compensation of the temperature compensation voltage is largely away from an optimal value.

A curve with black squares (■) shows a relationship between a compensation voltage $V_{COMP}$ of the VC-TCXO 1 of the present embodiment and a temperature T.

From measured values of FIG. 6A, it is apparent that when the external control voltage Vc is higher than the center value Vcm, a curve of the compensation voltage $V_{COMP}$ is compressed.

Figure 6B:
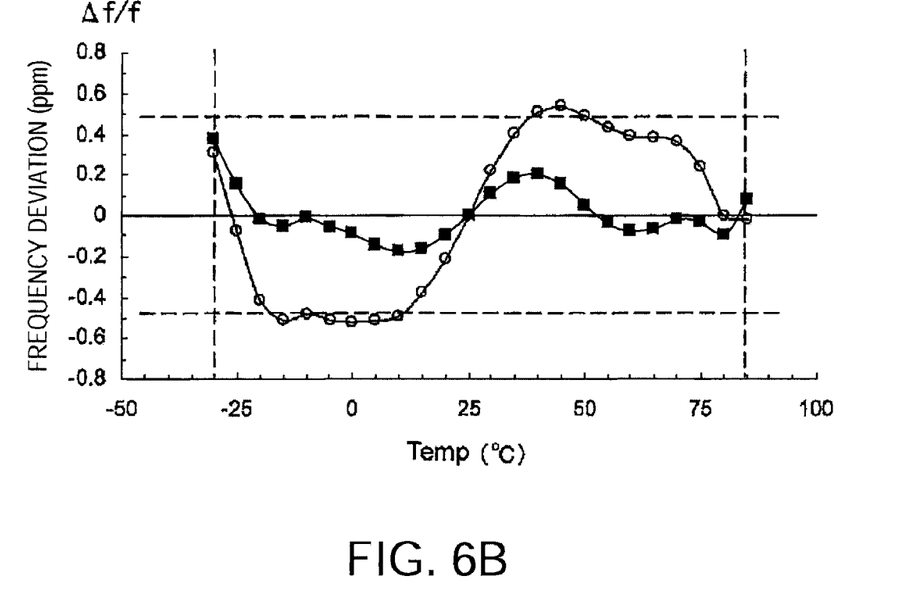
FIG. 6B is a graph showing a frequency-temperature characteristic of the related art and a frequency-temperature characteristic of the present embodiment in actual measurement.

FIG. 6B is a graph showing a frequency (Δf/f)-temperature (T) characteristic. In FIG. 6B, a curve with white circles (○) shows a frequency (Δf/f)-temperature (T) characteristic of a related art VC-TCXO, and a curve with black squares (■) shows a frequency (Δf/f)-temperature (T) characteristic of the VC-TCXO 1 of the present invention.

As is apparent from the curve with white circles (○) of FIG. 6B, the related art VC-TCXO has had such a problem that when the external control voltage Vc is increased, a frequency-temperature characteristic curve which has been adjusted within a predetermined frequency deviation (±0.5 ppm) is shifted (deteriorated) from the primary value of the frequency-temperature characteristic curve so as to be away from the predetermined frequency deviation.

In contrast, in the VC-TCXO 1 of the present embodiment, since the gain variable circuit 8 outputs the temperature compensation voltage controlled depending on the magnitude of the external control voltage Vc, the frequency-temperature characteristic remains within a primary adjustment range, as shown by the curve with black squares (■) in FIG. 6B.

Figure 7:
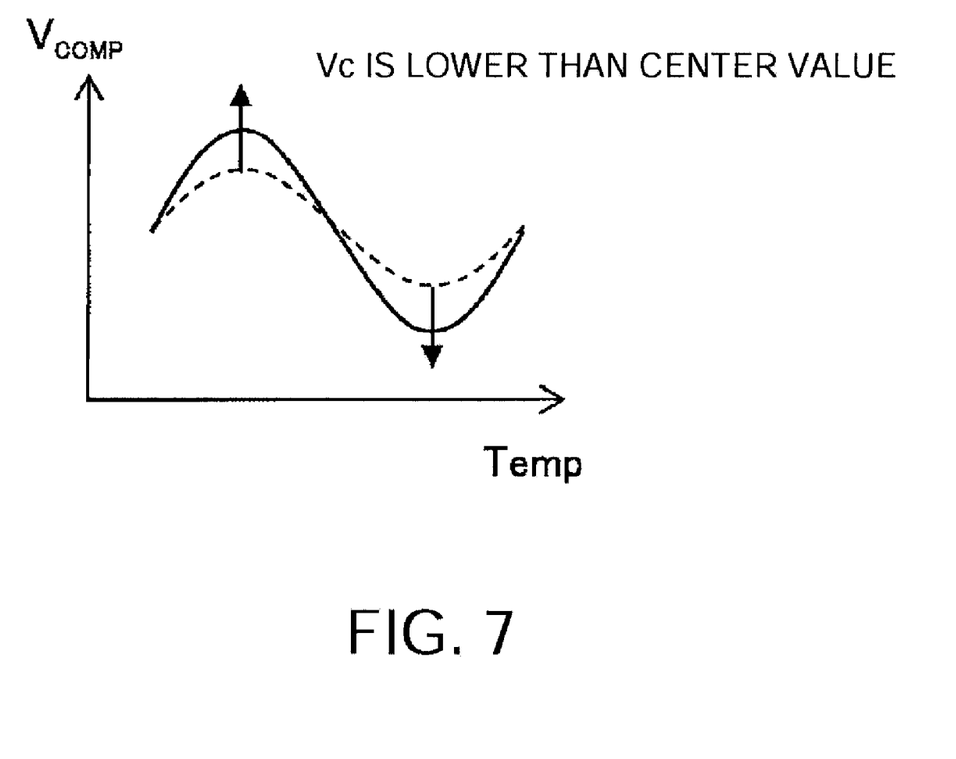
FIG. 7 is a graph showing a temperature characteristic of the related art temperature compensation voltage and a temperature characteristic of the temperature compensation voltage of the present embodiment in a case where the external control voltage Vc is lower than the center value.

The voltage $V_{AFC2}$ varying in proportion to the voltage Vc is applied to the gate G of the nMOS-FET 11. Therefore, when the external control voltage Vc is lower than the center value Vcm, the $V_{AFC2}$ is smaller than a drain current of a case where the external control voltage Vc is the center value Vcm. That is, the resistance value of the nMOS-FET 11 is large. The nMOS-FET 11 and the resistor R11 are coupled in parallel, so that their combined resistance $R_A$ is large. The gain of the gain variable circuit 8 is expressed as $-R_A/R10$, so that the gain of the gain variable circuit 8 is large. Accordingly, the temperature compensation voltage $V_{COMP}$ which is an output voltage of the gain variable circuit 8 is increased, and amplitude of a curve of the temperature compensation voltage $V_{COMP}$ is expanded from a dashed line to a solid line as shown in FIG. 7.

Figure 8A:
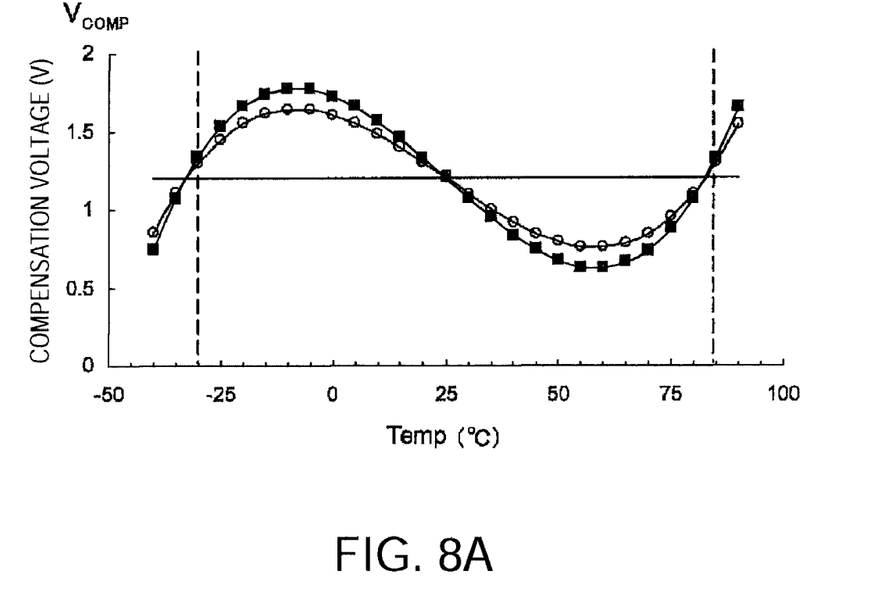
FIG. 8A is a graph showing a temperature characteristic of the temperature compensation voltage of the related art and a temperature characteristic of the temperature compensation voltage of the present embodiment in actual measurement.

FIG. 8A is a graph showing a relationship between a temperature T and a compensation voltage $V_{COMP}$ in a case where the external control voltage Vc is lower than the center value Vcm.

A curve with white circles (○) shows a relationship between a compensation voltage $V_{COMP}$ of a related art VC-TCXO and a temperature T. When the external control voltage Vc is low, the output voltage of the AFC circuit becomes high and therefore the capacitance of the variable capacitance element becomes large, thereby lacking sensitivity in the temperature compensation. That is, as difference between the external control voltage Vc and the center value Vcm becomes large, an amount of the temperature compensation of the temperature compensation voltage is away from an optimal value.

A curve with black squares (■) shows a relationship between a compensation voltage $V_{COMP}$ of the VC-TCXO 1 of the present embodiment and a temperature T. From measured values of FIG. 8A, it is apparent that when the external control voltage Vc is lower than the center value Vcm, the curve of the compensation voltage $V_{COMP}$ is expanded and thus the lack of the compensation sensitivity is compensated.

Figure 8B:
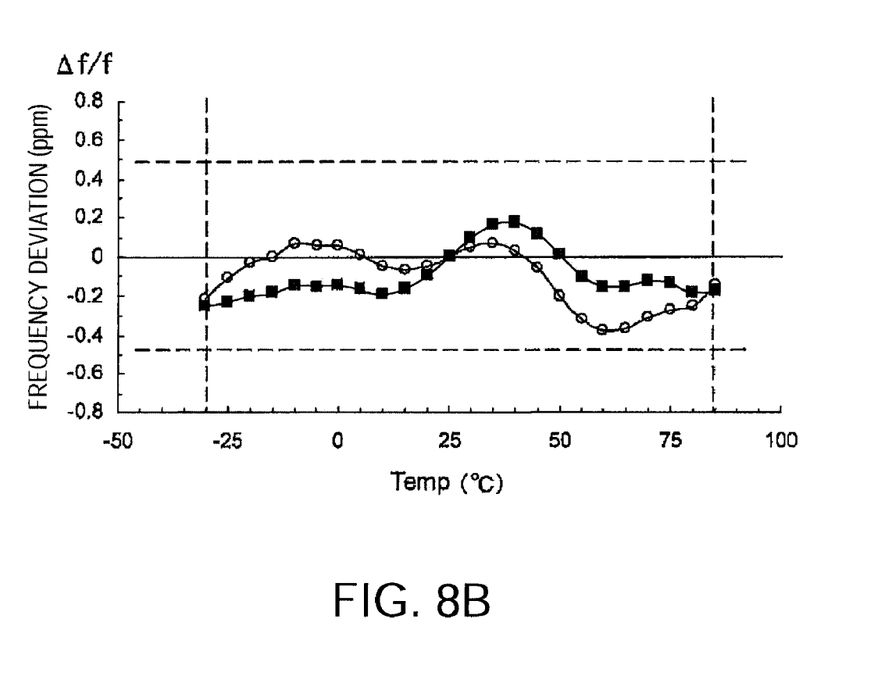
FIG. 8B is a graph showing a frequency-temperature characteristic of the related art and a frequency-temperature characteristic of the present embodiment in actual measurement.

FIG. 8B is a graph showing a frequency (Δf/f)-temperature (T) characteristic in the case where the external control voltage Vc is lower than the center value Vcm. In FIG. 8B, a curve with white circles (○) shows a frequency (Δf/f)-temperature (T) characteristic of a related art VC-TCXO, and a curve with black squares (■) shows a frequency (Δf/f)-temperature (T) characteristic of the VC-TCXO 1 of the present embodiment.

As apparent from the frequency-temperature characteristic of FIG. 8B, in the VC-TCXO 1 of the present embodiment, in a case where the external control voltage Vc is smaller than the center value Vcm, the gain of the gain variable circuit 8 is controlled so as to allow the gain variable circuit 8 to maintain the frequency-temperature characteristic within the predetermined frequency deviation.

Second Embodiment

Figures 9A, 9B, 9C:
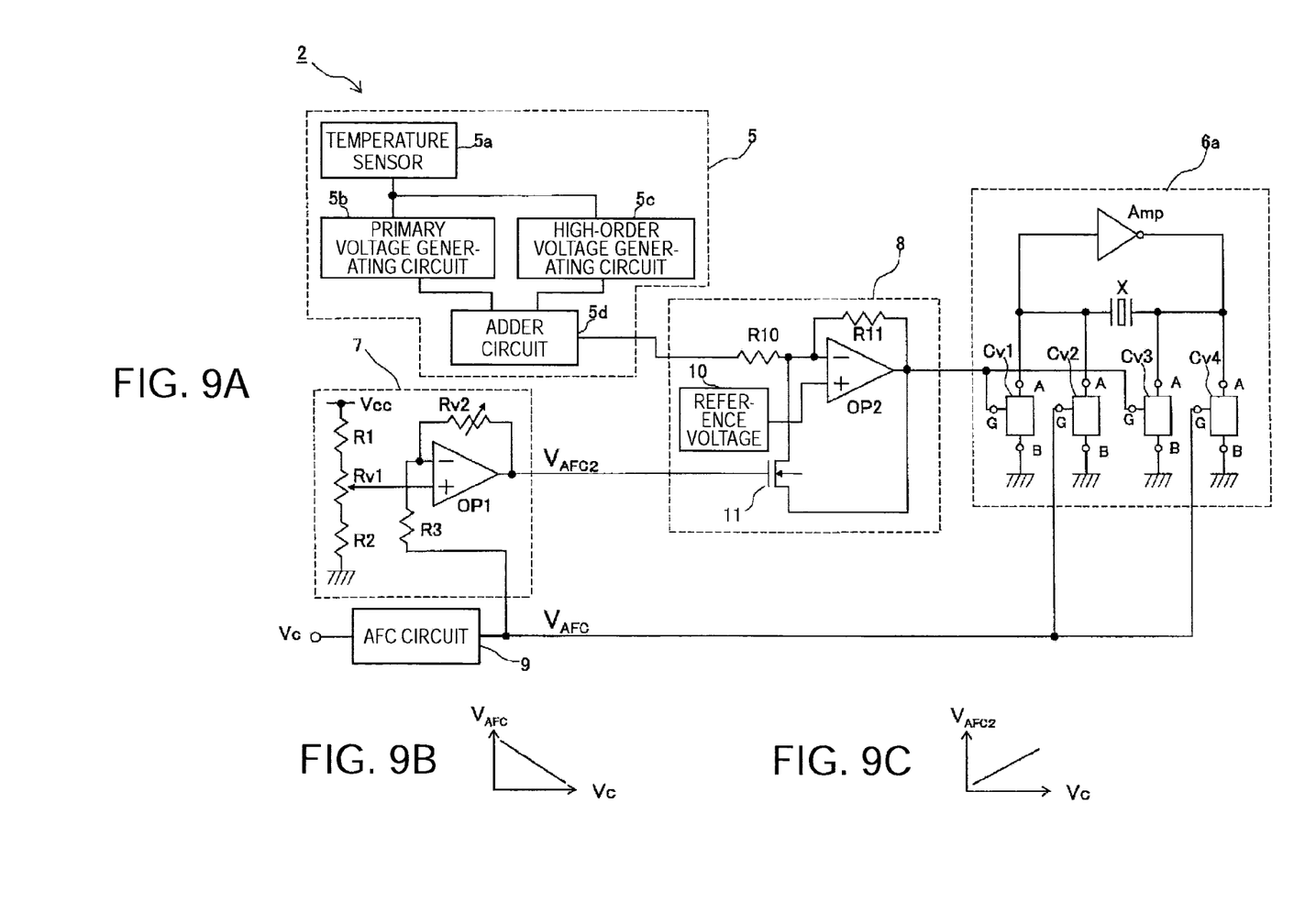
FIG. 9A is a circuit diagram showing a voltage control type temperature compensation piezoelectric oscillator according to a second embodiment.
FIG. 9B is a graph showing a relationship between an external control voltage Vc and an output voltage $V_{AFC}$.
FIG. 9C is a graph showing a relationship between the external control voltage Vc and an output voltage $V_{AFC2}$ of an offset compensation circuit 7.

FIG. 9A shows a VC-TCXO according to a second embodiment of the invention. The different point from the VC-TCXO 1 of FIG. 1A is that the VC-TXCO of the second embodiment includes a voltage control type oscillation circuit 6a instead of the voltage control type oscillation circuit 6.

In the voltage control type oscillation circuit 6a, first and third variable capacitance elements Cv1 and Cv3 for temperature compensation are respectively provided between both terminals of the piezoelectric resonator X and the ground, and second and fourth variable capacitance elements Cv2 and Cv4 for varying a center frequency are respectively provided between the both terminals of the piezoelectric resonator X and the ground.

This VC-TOXO 2 operates similarly to the VC-TCXO 1 shown in FIG. 1A, so that the description of the operation will be omitted.

In the voltage control type oscillation circuit 6a of the VC-TCXO 2 structured as above, the variable capacitance elements Cv1 and Cv3 for temperature compensation are symmetrically disposed at the both sides of the piezoelectric resonator when viewed from the piezoelectric resonator, and the variable capacitance elements Cv2 and Cv4 for varying a center frequency are disposed in the same manner. Therefore, the VC-TCXO 2 has a stable oscillation frequency and the frequency-temperature characteristic is maintained at a specified value even though the external control voltage is varied, advantageously.

Third Embodiment

Figures 10A, 10B, 10C:
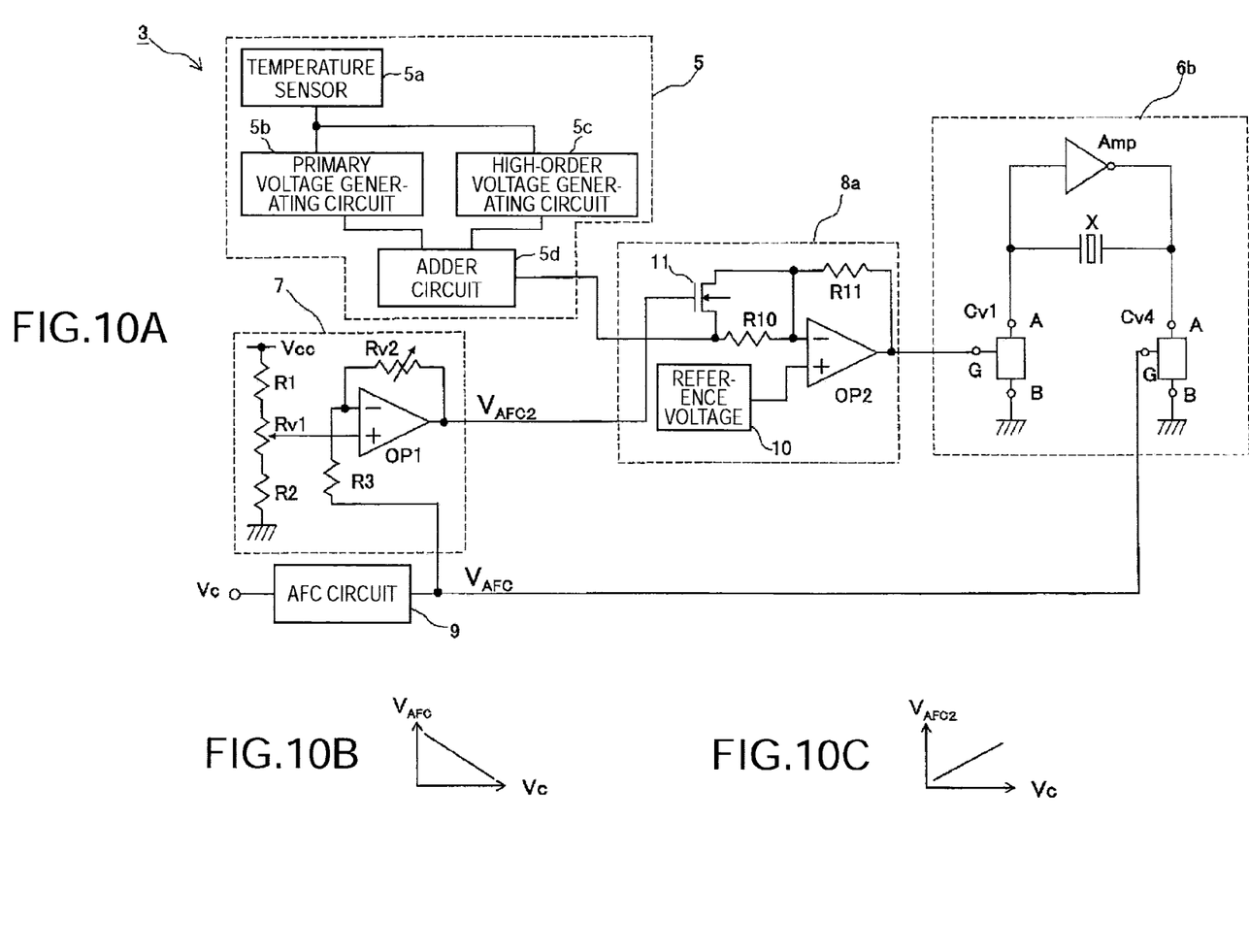
FIG. 10A is a circuit diagram showing a voltage control type temperature compensation piezoelectric oscillator according to a third embodiment.
FIG. 10B is a graph showing a relationship between an external control voltage Vc and an output voltage $V_{AFC}$.
FIG. 10C is a graph showing a relationship between the external control voltage Vc and an output voltage $V_{AFC2}$ of an offset compensation circuit 7.

FIG. 10A shows a VC-TCXO 3 according to a third embodiment of the invention. The different point from the VC-TCXO 1 of FIG. 1A is that the VC-TXCO 3 includes a gain variable circuit 8a and a voltage control type oscillation circuit 6b instead of the gain variable circuit 8 and the voltage control type oscillation circuit 6.

The gain variable circuit 8a includes: an operational amplifier OP2; first and second resistors R10 and R11; a transistor (nMOS-FET) 11; and a reference voltage 10. In the gain variable circuit 8a, an output of the reference voltage 10 is coupled to a non-inverting input terminal of the operational amplifier OP2, and an output of the adder circuit 5d of the temperature compensation voltage generating circuit 5 is coupled to an inverting input terminal of the operational amplifier OP2 through the resistor R10. An output of the operational amplifier OP2 is coupled to the inverting input terminal through the resistor R11, and an output of the offset compensation circuit 7 is coupled to a gate of the nMOS-FET (transistor) 11 so as to couple a drain terminal and a source terminal of the nMOS-FET 11 in parallel with respective terminals of the resistor R10.

The voltage control type oscillation circuit 6b includes: a piezoelectric resonator X; an amplifier Amp; and first and fourth variable capacitance elements Cv1 and Cv4. The voltage control type oscillation circuit 6b has such a structure that the amplifier Amp and the piezoelectric resonator X is coupled in parallel, the first variable capacitance element Cv1 for temperature compensation is coupled between one terminals of the piezoelectric resonator X and the amplifier Amp and the ground, and the fourth variable capacitance element Cv4 for varying a frequency is coupled between the other terminals of the resonator X and the amplifier Amp and the ground.

The gain variable circuit 8a is described below.

The voltage $V_{AFC2}$ varying in proportion to the voltage Vc is applied to the gate G of the nMOS-FET 11. Therefore, when the external control voltage Vc of the VC-TCXO 3 is higher than the center value Vcm, the voltage $V_{AFC2}$ is larger than a drain current of a case where the external control voltage Vc is the center value Vcm. That is, a resistance value of the nMOS-FET 11 is small. The nMOS-FET 11 and the resistor R10 are coupled in parallel, so that their combined resistance $R_B$ is small.

Figure 11A:
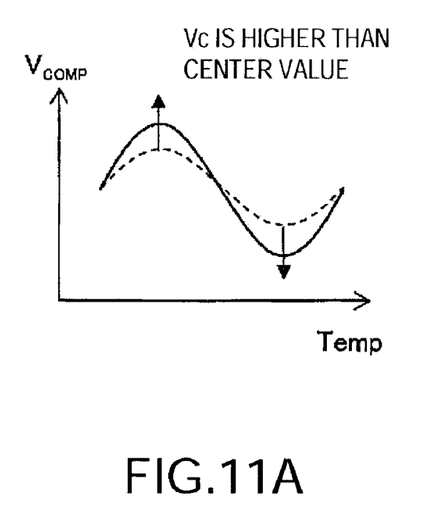
FIG. 11A is a graph showing a temperature characteristic of a temperature compensation voltage of a related art and a temperature characteristic of a temperature compensation voltage of the present embodiment in a case where the external control voltage Vc is higher than a center value.

A gain of the gain variable circuit 8a is expressed as $-R11/R_B$, the gain of the gain variable circuit 8 is large. Therefore, amplitude of a temperature compensation voltage $V_{COMP}$ which is an output voltage of the gain variable circuit 8a is large. Accordingly, as shown in FIG. 11A, the amplitude of a temperature compensation voltage $V_{COMP}$ curve is expanded from a dashed line to a solid line.

Figure 11B:
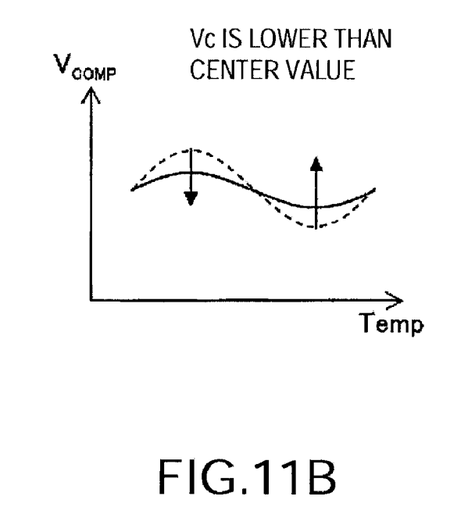
FIG. 11B is a graph showing a temperature characteristic of a temperature compensation voltage of a related art and a temperature characteristic of a temperature compensation voltage of the present embodiment in a case where the external control voltage Vc is lower than the center value.

The voltage $V_{AFC2}$ varying in proportion to the voltage Vc is applied to the gate G of the nMOS-FET 11. Therefore, when the external control voltage Vc of the VC-TCXO 3 is lower than the center value Vcm, the voltage $V_{AFC2}$ is smaller than a drain current of a case where the external control voltage Vc is the center value Vcm. That is, the resistance value of the nMOS-FET 11 is large. The nMOS-FET 11 and the resistor R10 are coupled in parallel, so that their combined resistance $R_B$ is large. The gain of the gain variable circuit 8*a* is expressed as $-R11/R_B$, the gain of the gain variable circuit 8*a* is small. Therefore, the amplitude of the temperature compensation voltage $V_{COMP}$ which is the output voltage of the gain variable circuit 8*a* is small. Accordingly, as shown in FIG. 11B, the amplitude of the temperature compensation voltage $V_{COMP}$ curve is compressed from a dashed line to a solid line.

In the VC-TCXO 3 of the third embodiment shown in FIG. 10, the gain variable circuit 8*a* operates in an opposite manner to the gain variable circuit 8 shown in FIG. 1A depending on whether the external control voltage Vc is higher or lower than the center value Vcm.

In the VC-TCXO 3, since the gain variable circuit 8*a* outputs the temperature compensation voltage by controlling it depending on the magnitude of the external control voltage Vc, the frequency-temperature characteristic is maintained approximately within the initially adjusted range.

When the gain variable circuit 8 is modified to have the above structure, a more proper gain variable circuit can be selected, thus providing a wider selecting range of a gain variable circuit advantageously.

The entire disclosure of Japanese Patent Application Nos. 2008-300517 filed Nov. 26, 2008 is expressly incorporated by reference herein.

What is claimed is:

1. A voltage control type temperature compensation piezoelectric oscillator, comprising:
   a voltage control type oscillation circuit;
   an automatic frequency control (AFC) circuit outputting a control voltage for controlling an oscillation frequency of the voltage control type oscillation circuit based on an external control voltage;
   a temperature compensation voltage generating circuit generating a temperature compensation voltage; and
   a gain variable circuit varying a gain of the temperature compensation voltage, the gain variable circuit includes an operational amplifier, a first resistor, a second resistor, a transistor, and a reference voltage, and the second resistor and the transistor are coupled in parallel and are coupled to an input terminal and an output terminal of the operational amplifier; wherein
   the gain variable circuit is controlled by the control voltage outputted from the AFC circuit, and the oscillation frequency of the voltage control type oscillation circuit is controlled by an output voltage of the gain variable circuit.

2. A voltage control type temperature compensation piezoelectric oscillator, comprising:
   a voltage control type oscillation circuit;
   an automatic frequency control (AFC) circuit outputtinq a control voltage for controlling an oscillation frequency of the voltage control type oscillation circuit based on an external control voltage;
   a temperature compensation voltage generating circuit generating a temperature compensation voltage; and
   a gain variable circuit varying a pain of the temperature compensation voltage, the gain variable circuit includes an operational amplifier, a first resistor, a second resistor, a transistor, and a reference voltage, and the first resistor and the transistor are coupled in parallel and are coupled to an input terminal of the operational amplifier; wherein
   the pain variable circuit is controlled by the control voltage outputted from the AFC circuit, and the oscillation frequency of the voltage control type oscillation circuit is controlled by an output voltage of the gain variable circuit.

* * * * *